(12) United States Patent
Sasaki

(10) Patent No.: US 7,744,731 B2
(45) Date of Patent: Jun. 29, 2010

(54) SPUTTERING APPARATUS OF FORMING THIN FILM

(75) Inventor: Masao Sasaki, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 16 days.

(21) Appl. No.: 12/336,810

(22) Filed: Dec. 17, 2008

(65) Prior Publication Data

US 2009/0127098 A1 May 21, 2009

Related U.S. Application Data

(63) Continuation of application No. PCT/JP2008/060274, filed on Jun. 4, 2008.

(30) Foreign Application Priority Data

Jun. 4, 2007 (JP) .............................. 2007-148362

(51) Int. Cl.
*C23C 14/35* (2006.01)
(52) U.S. Cl. ............................ 204/192.29; 204/192.26; 204/298.11; 204/298.14; 204/298.2; 204/298.25
(58) Field of Classification Search ............ 204/192.26, 204/192.29, 298.11, 298.14, 298.2, 298.25
See application file for complete search history.

(56) References Cited

U.S. PATENT DOCUMENTS

| 5,833,815 A | 11/1998 | Kim et al. .............. 204/192.12 |
| 2003/0089601 A1 | 5/2003 | Ding et al. ............... 204/298.2 |

FOREIGN PATENT DOCUMENTS

| JP | 63-103060 | 5/1988 |
| JP | 08-167479 | 6/1996 |
| JP | 09-272973 | 10/1997 |
| JP | 10/046334 | 2/1998 |
| JP | 11/246969 | 9/1999 |
| JP | 2000-345335 | 12/2000 |
| JP | 2002-146528 | 5/2002 |
| JP | 2002-220663 | 8/2002 |
| JP | 2005-510045 | 4/2005 |

*Primary Examiner*—Rodney G McDonald
(74) *Attorney, Agent, or Firm*—Fitzpatrick, Cella, Harper & Scinto

(57) ABSTRACT

A sputtering deposit apparatus capable of depositing a thin film having uniform sheet resistance value is provided. The sputtering deposit apparatus is arranged with at least two magnetron sputtering units within a film deposit chamber. On the upstream side in the substrate transfer direction 43 of the target shield 55 provided on the magnetron sputtering unit disposed on the most upstream side in the substrate transfer direction, of at least the two magnetron sputtering units, there is disposed the first cathode shield 62 which is electrically insulated.

20 Claims, 5 Drawing Sheets

SPUTTERING APPARATUS OF FORMING THIN FILM

CROSS-REFERENCES TO RELATED APPLICATIONS

This application is a continuation application of International Application No. PCT/JP2008/060274, filed on Jun. 4, 2008, the entire contents of which are incorporated by reference herein.

This application also claims the benefit of priority from Japanese Patent Application No. 2007-148362 filed Jun. 4, 2007, the entire contents of which is incorporated herein by reference.

TECHNICAL FIELD

The present invention relates to a film deposit apparatus for depositing an ITO thin film on a substrate by sputtering and, in particular, to a substrate transfer type of successive film deposit apparatus that perform film deposit while swinging a magnet.

BACKGROUND ART

As a substrate transfer type of successive film deposit apparatus having a plurality of magnetron sputtering units, there has been known an apparatus that performs sputtering by swinging a magnet of the magnetron sputtering unit, such as disclosed in Patent Document 1. A successive sputtering deposit apparatus such as disclosed in Patent Document 1 is configured so that a magnet (magnetic circuit) of respective magnetron sputtering units independently performs movement by reciprocating movement. This is because why a traveling speed of the magnet in a substrate transfer direction is sufficiently high relative to the substrate transfer speed and therefore film thickness distribution on a thin film deposited by each of the magnetron sputtering units is sufficiently uniform in the substrate transfer direction.

However, for high mechanical durability of the magnet movement unit or reduction in nodule generated on a target surface as disclosed in Patent Document 1, magnet movement speed requires to be lower than before. When the movement speed of the magnet in the substrate transfer direction is almost the same as the transfer speed of a substrate, the uniformity of a thin film deposited on the substrate in the substrate transfer direction becomes remarkably worse.

As disclosed in Patent Document 2 and 3, there has been proposed a method for adjusting phases of magnet movement of a plurality of magnetron sputtering units and shifting the positions of films on an uneven substrate for overlapping. Such a method has improved the evenness of a thin film in the substrate transfer direction of the thin film deposited on the substrate.

Patent Document 1: Japanese Patent Application Laid-Open No. 2000-345335

Patent Document 2: Japanese Patent Application Laid-Open No. H11-246969

Patent Document 3: Japanese Patent Application Laid-Open No. 2002-146528

DISCLOSURE OF THE INVENTION

However, in the conventional sputtering apparatus, a sheet resistance value may change in a transfer direction of a substrate when an ITO film is deposited on the substrate. In recent years, a device in which a substrate formed with an ITO film on a substrate is built has had high functionality and therefore the ITO film requires to have lower resistivity.

FIG. 6 illustrates a sheet resistance value of an ITO film formed by a conventional sputtering deposit apparatus. The position on a substrate in a substrate transfer direction illustrated in FIG. 6 indicates a position when four substrates having thin films deposited by the conventional sputtering apparatus are arranged. The sheet resistance value indicates a sheet resistance value measured after film deposit of an ITO film at a position on a substrate in a substrate transfer direction by a film deposit apparatus. The sheet resistance value periodically changes at a position of a substrate in a transfer direction as illustrated in FIG. 6. Accordingly, distribution occurs in the sheet resistance on each substrate and further the distribution in the sheet resistance value differs for each substrate.

It is therefore an object of the present invention to provide a sputtering deposit apparatus capable of uniformizing a sheet resistance value and of depositing an ITO film having low resistance. It is another object of the present invention to provide a substrate manufacturing method capable of uniformizing a sheet resistance value on the substrate and of forming an ITO film having a low resistance on a substrate.

According to the present invention, a film deposit apparatus for an ITO film, including at least two magnetron sputtering units arranged in a film deposit chamber in a substrate transfer direction to convey substrates while sequentially making the substrates oppose each of at least the two magnetron sputtering units in the substrate transfer direction and to sequentially perform sputtering deposit while the substrates are being made to oppose each of at least the two magnetron sputtering units during conveyance of the substrates, is characterized in that: the magnetron sputtering units include: a magnet reciprocating in a substrate transfer direction; a target, a target shield of a floating structure provided adjacent to an outer-periphery portion of the target and electrically insulated; and cathode shields provided adjacent to the outside of the target shield as a cathode shield (first cathode shield) on the upstream side in the substrate transfer direction of the cathode shields provided on the magnetron sputtering unit disposed on the most upstream side, in the substrate transfer direction, of at least the two magnetron sputtering units, is of a floating structure electrically insulated and the second cathode shield as subsequent another cathode shield (second cathode shield) is connected to a predetermined potential (for example, a ground potential).

A film deposit apparatus for an ITO film, including at least two magnetron sputtering units disposed in series and substrate transfer means for transferring a substrate in a substrate transfer direction along the serial direction, is characterized in that each of the magnetron sputtering units includes: magnet reciprocating means for reciprocating a magnet along the substrate transfer direction; target setting means for setting an ITO target; a target shield which is disposed adjacent to an outer-periphery portion of the ITO target and is of an electrically-insulated floating structure; and a cathode shield disposed adjacent to the outside of the target shield, and, of the cathode shields, a first cathode shield which is a cathode shield positioned on the most upstream side in the substrate transfer direction is electrically insulated and is of a floating structure, and a second cathode shield which is subsequent another cathode shield is connected to a predetermined voltage.

The film deposit apparatus for the ITO film according to claim 1 is characterized in that the top face of the first cathode shield is approximately flush with the target surface in a height in the direction perpendicular to the target surface.

A method for manufacturing an element including a process of forming an ITO film on a substrate, is characterized in that an ITO film is formed on a substrate, using the film deposit apparatus described above.

According to the present invention, a sheet resistance value can be uniformized and an ITO film having a low resistance can be deposited.

Figure 1:
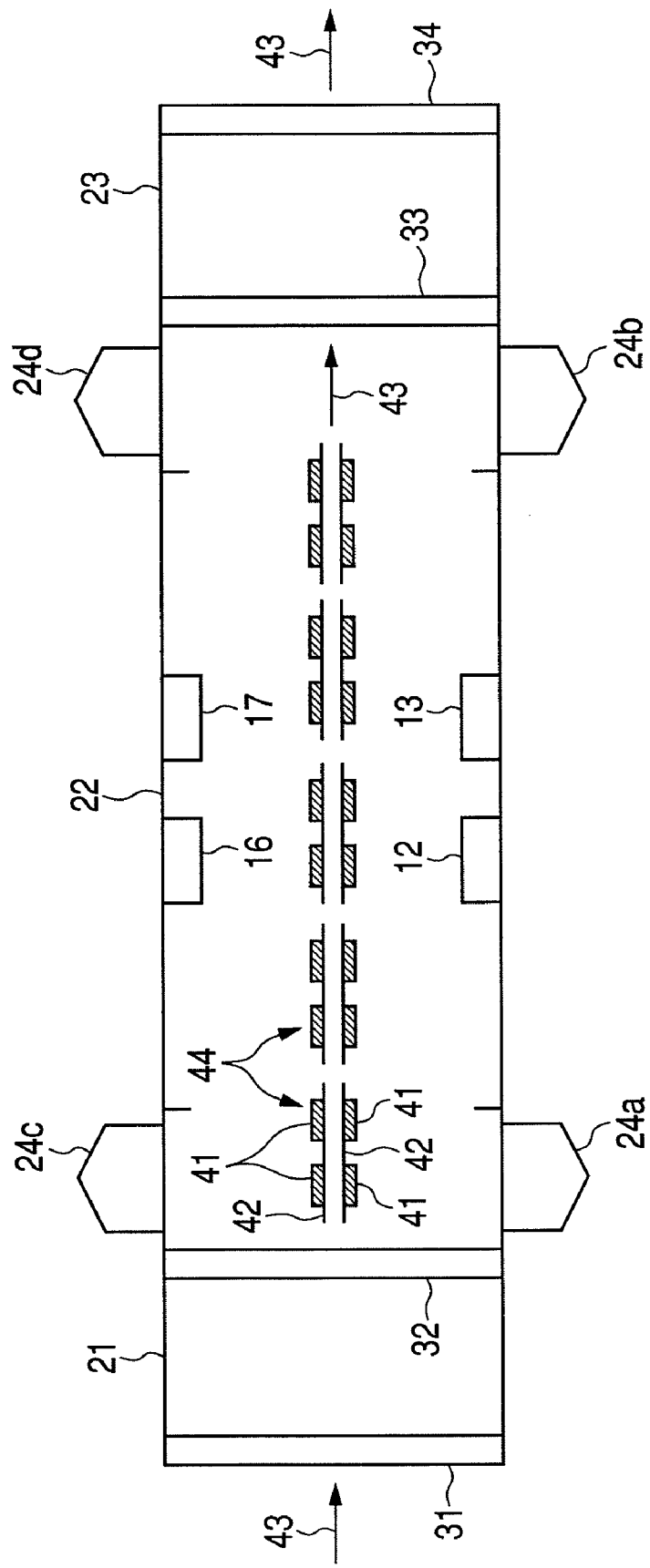
FIG. 1 is a sectional view illustrating a schematic configuration of a substrate transfer type of successive sputtering apparatus according to a first embodiment of the present invention.

DESCRIPTION OF SYMBOLS 21 load lock chamber
22 film deposit chamber
23 unload lock chamber
41 substrate
42 tray
51 target
52 backing plate
53 target fixing insulator
54 chamber wall
55 target shield
56 magnet
57 magnet movement unit
58 target shield fixing insulator
60 second cathode shield
61 cathode shield fixing block
62 first cathode shield
63 cathode shield fixing insulator
64 gas inlet

BEST MODES FOR CARRYING OUT THE INVENTION

Next, Embodiments of the present invention will be described with reference to the accompanying drawings.

First Embodiment

FIG. 1 is a sectional view illustrating a schematic configuration of a substrate transfer type of successive sputtering apparatus according to a first embodiment of the present invention.

FIG. 1 illustrates a typical embodiment of an apparatus in which a sputtering deposit method according to the present invention is implemented. This apparatus is a substrate transfer type sputtering deposit apparatus in which a plurality of, for example, four magnetron sputtering units 12, 13, 16, 17 are arranged in a film deposit chamber. In the sputtering deposit apparatus, a load lock chamber 21, a film deposit chamber 22 and an unload lock chamber 23 are connected to each other in series. Between an outside end portion of a load lock chamber 21, the load lock chamber 21 and a film deposit chamber 22, between the film deposit chamber 22 and the unload lock chamber 23, and at an outside end portion of the unload lock chamber 23, gate valves 31, 32, 33, 34 are provided, respectively. The gate valves air-tightly partition the chamber and the outside and between the chambers. A substrate 41 to be deposited is delivered from the gate valve 31 in a condition mounted on a tray 42, conveyed from the left to the right in FIG. 1 as shown by an arrow 43 and passes through the film deposit chamber 22 for film deposit. Subsequently, the substrate passes through the unload lock chamber 23 and the gate valve 34 and is carried out to the outside. On the film deposit chamber 22, for example, there are attached four cryopumps 24a to 24d for exhaust to be a required vacuum condition. In addition, the load lock chamber 21 and the unload lock chamber 23 are exhausted by a dry pump (not illustrated).

In the film deposit chamber 22, two pairs (12 and 16, 13 and 17) of magnetron sputter units are disposed in series along a substrate transfer direction so as to oppose each other at inner surfaces of side wall portions on both sides. FIG. 1 is a top view of the apparatus according to the present invention and, in the respective magnetron sputtering units, a target is positioned in a vertically standing upright state. Within the film deposit chamber 22, one set of two trays 42 is positioned in parallel in a vertically standing state. A plurality of units 44 in which, for example, two substrates 41 are mounted on the outer side surfaces of the respective trays 42 are moved in a single line arrangement at a predetermined transfer speed in the direction of an arrow 43 by a tray transfer unit (not illustrated). The substrates 41 mounted on each of the two trays 42 are sequentially made to oppose the magnetron sputtering units 12 to 17 during substrate transfer. While the substrates are opposing the sputtering units, sputtering deposit is sequentially performed. The configuration of the film deposit chamber 22 as illustrated in FIG. 1 is of both-face film deposit type, but a configuration of single-face film deposit type may be used.

Figure 2:
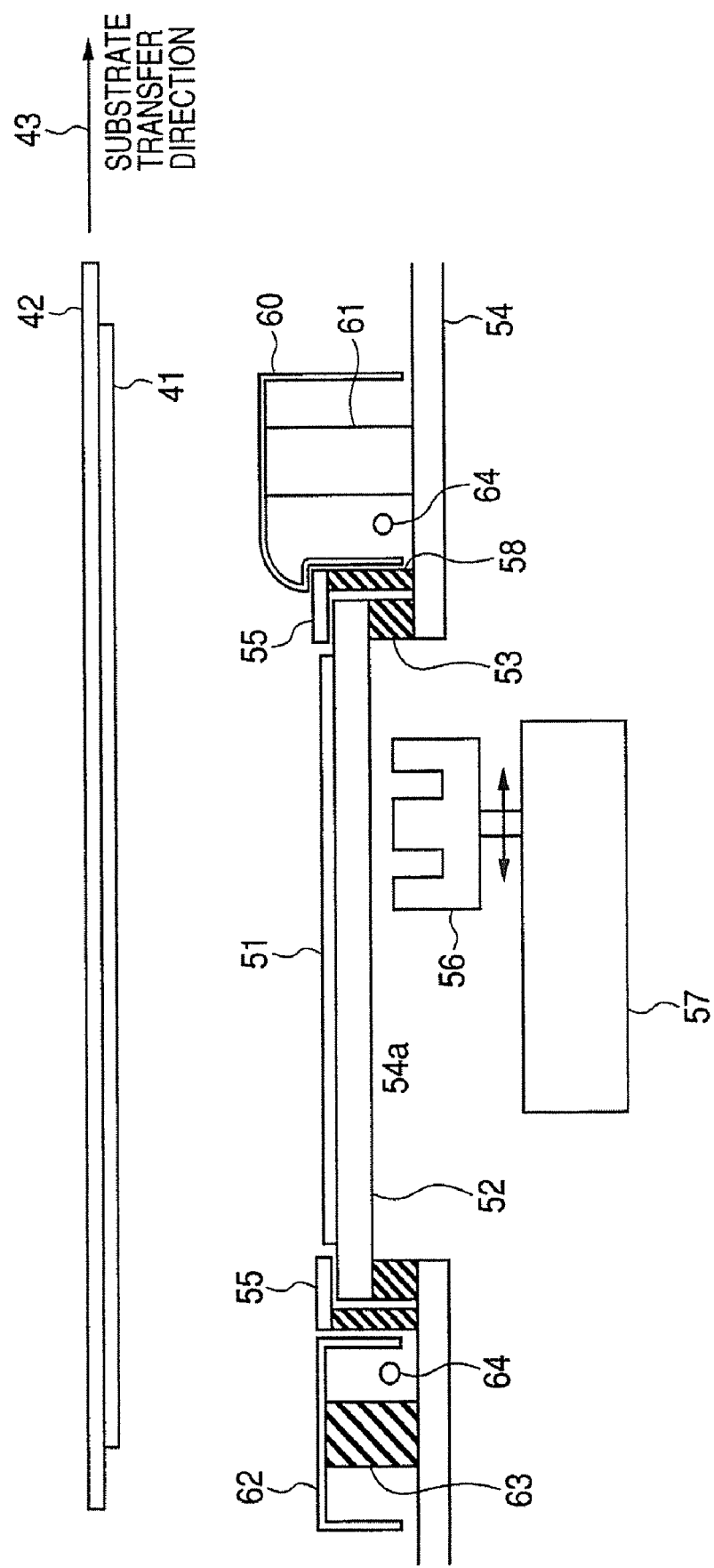
FIG. 2 is a view illustrating a configuration of a first magnetron sputtering unit disposed on the most upstream side in the substrate transfer direction of the magnetron sputtering units disposed on both side faces of a film deposit chamber illustrated in FIG. 1.

Next, referring to FIG. 2, a configuration of a magnetron sputtering unit will be described. FIG. 2 illustrates a configuration of magnetron sputtering units 12, 16 disposed respectively on the most upstream side in the substrate transfer direction (hereinafter referred to as a "first magnetron sputtering unit") of magnetron sputtering units disposed on both side surfaces of a film deposit chamber illustrated in FIG. 1. Of course, the magnetron sputtering unit not only includes a pair configuration facing with each other (12 and 16), but also one configuration (12 or 16). In this case as well, the magnetron sputtering unit on the most upstream side is referred to as a first magnetron sputtering unit.

The tray 42 and the substrate 41 move from the left to the right as shown by reference number 43 in FIG. 2. A target 51 is provided on a packing plate 52 serving as target setting means, and the packing plate 52 is attached on a chamber wall 54 so as to cover an opening portion 54a in the chamber wall 54 through a target fixing insulator 53. The back face portion of the packing plate 52 is in the atmosphere.

In an example illustrated in FIG. 2, the target 51 has a rectangular shape and, adjacent to an outer-periphery portion thereof, a target shield 55 is provided. The target shield 55 is shaped into a rectangular frame so as to surround the rectangular target 51. The target shield 55 has a function of preventing spurring of an exposure portion of the packing plate (a vacuum-atmosphere-side face of the packing plate 52 not covered with the target 51) as well as adhesion of a thin film to the fixing insulator fixing a target. The target shield 55 is heated by plasma because the target shield 55 is positioned close to the target 51. With the target shield made to the ground potential, large current flows and temperature rises, so that deformation may occur when the magnet moves to come closer. Accordingly, the target shield 55 is mounted on the chamber wall 54 through a target shield fixing insulator 58 and electrically insulated, that is, is floated. Hence no current flows into the target shield and deformation due to heat is inhibited.

A DC power supply (not illustrated) is connected to the target 51 to supply required electric power. The substrate 41 transferred to the target 51 of the magnetron sputtering unit moves in parallel while a face to be film-deposited of the substrate is opposing the target 51. At a portion of the opening portion 54a on the atmosphere side of the packing plate 52, there are disposed a magnet 56 and a magnet movement unit 57 for reciprocating the magnet. The magnet 56 is generally constructed from a rod-like center magnet and a ring-shaped outer magnet surrounding the center magnet. The magnet 56 is reciprocated along the substrate transfer direction 43 in the atmosphere behind the target 51 by the magnet movement unit 57.

The gas inlet 64 is provided outside both ends of a target in the magnetron sputtering unit. Ar gas as sputtering gas and $O_2$ (oxygen) gas as reactive gas are introduced from the gas inlet. The gas inlet is provided outside both ends of a target and therefore the concentration of oxygen gas flowing on a surface of the target becomes uniform, thus improving uniformity of reaction between reactive gas and target.

When gas is supplied until approximately 0.5 Pa is obtained and a negative voltage is applied to the target 51 from a DC power supply, plasma having high density is formed around just above a magnet in the vicinity of a surface of the target 51 to generate electric discharge. When Ar ion in the plasma as the main is accelerated in the direction of the target 51 at an electric field in a sheath around a surface of the target 51 and is made incident on the target, In, Sn and O which are atoms constructing a target material are sputtered. Most portions of the atoms reach the substrate and are deposited on the substrate as an ITO film and, at this time, are deposited as a thin film while reacting to oxygen gas, so that properties of an ITO film deposited on the substrate are controlled by oxygen gas partial pressure. The sputter used herein is the so-called flat-plate planar magnetron sputter. By a magnetic field generated between the rod-like center-magnet of the magnet and the ring-shaped outer magnet surrounding the center-magnet, electrons are drifted around a target surface, and thereby plasma having high density can be formed just above the magnet. Targets in a region of the plasma having high density are sputtered much more and, from the region, many sputter atoms are released. The targets are consumed by just that much. In the case of a fixed magnet, the targets are consumed unevenly or ununiformly and therefore the magnet is moved to consume the target evenly.

Figure 3:
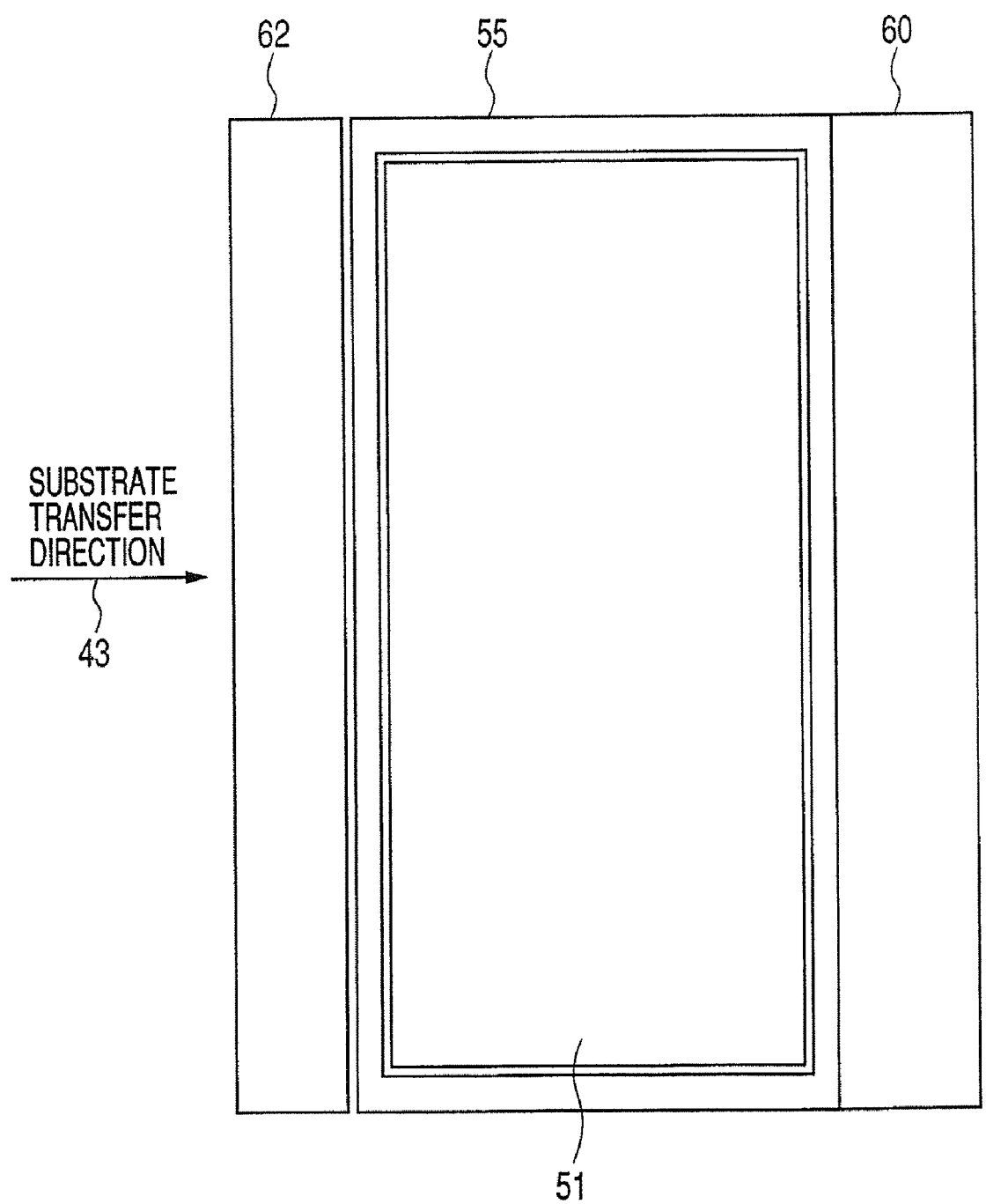
FIG. 3 is a plan view illustrating a target, a target shield and a cathode shield of the magnetron sputtering unit illustrated in FIG. 2.

FIG. 3 is a plan view illustrating a target, a target shield and a cathode shield of the magnetron sputtering unit illustrated in FIG. 2. The target 51 is rectangular and the target shield 55 of a square frame shape is disposed so as to surround the outer periphery thereof. In this sample, a clearance between the target 51 and the target shield 55 is 2 mm and the width of the target shield 55 is 60 mm.

On the upstream side in the substrate transfer direction 43 to the target 51 (hereinafter referred to as "LL side"), the first cathode shield 62 is disposed. The first cathode shield 62 is disposed at an interval of 2 mm relative to the target shield 55. The height level of the first cathode shield 62 in a perpendicular direction to a surface of the target 51 is almost the same as that of the target shield 55 and is lower than a second cathode shield 60 which is higher than that of the target shield 55 by a predetermined distance. That a height level is almost the same means that heights of the target shield and the cathode shield align with each other in the substrate transfer direction, specifically, a difference between height levels of the target shield and cathode shield is 5 mm or less.

A width of the first cathode shield 62 in the substrate transfer direction 43 is 113 mm. Preferably, a width of the first cathode shield 62 in the substrate transfer direction 43 is at least 50 mm. The first cathode shield 62 is fixed on the chamber wall 54 through a cathode shield fixing insulator 63, and is electrically insulated and configured to be potentially floating.

On the downstream side in the substrate transfer direction 43 (hereinafter referred to as "ULL side") relative to the target 51, there is disposed the second cathode shield 60. The second cathode shield 60 is disposed so as to cover a part of the target shield 55 while a clearance of 2 mm is being kept relative to the target shield 55 and becomes higher as the cathode shield goes away from the target 55. In the present embodiment, a height of the second cathode shield 60 is 40 mm from a surface of the target 51, and a width of the second cathode shield 60 in the substrate transfer direction 43 is 143 mm. The second cathode shield 60 is fixed on the chamber wall 54 through a metallic cathode shield fixing block 61, and is electrically grounded and has a ground potential. The metallic cathode shield fixing block 61 functions as a connection portion for connecting the second cathode shield to a predetermined potential (e.g. ground potential).

The second magnetron sputtering units 13, 17, which are other magnetron sputtering units are disposed, has the second cathode shield 60 on the upstream side as well in a substrate transfer direction 43 relative to the target 51 disposed through the cathode shield fixing block 61. Other configurations of the second magnetron sputtering units 13, 17 are the same as that of the first magnetron sputtering unit.

In the present embodiment, as illustrated in FIG. 1, the two types of magnetron sputtering units: the first magnetron sputtering units 12, 16 and the second magnetron sputtering units 13, 17 are sequentially arranged, toward from the upstream side to the downstream side in the substrate transfer direction 43, at respective side faces of the film deposit chamber 22. On the other hand, respective side faces of the film deposit chamber 22 may be arranged with three or more magnetron sputtering units. In this case, the magnetron sputtering unit on the most upstream side in the substrate transfer direction 43 is taken as a first magnetron sputtering unit and the other magnetron sputtering units are taken as a second magnetron sputtering unit, respectively.

Next, film deposit by a sputtering apparatus according to the present embodiment will be described. In the present embodiment, a substrate transfer velocity was 348.2 mm/min, a magnet movement width was 160 mm and a substrate-transfer-direction reciprocating period of a magnet was two minutes. Preferably, the substrate-transfer-direction reciprocating period of the magnet is one or more minutes for mechanical durability of a magnet unit and reduction in joule.

In addition, a movement velocity of the magnet in a substrate transfer direction was 109.6 mm/min and a movement velocity in the reverse direction was 296.0 mm/min. The first magnetron sputtering unit and the second magnetron sputtering unit have the same magnet movement method with a reversed phase.

As a material of each target, ITO (indium, tin oxide) including $SnO_2$ of 10 wt % was used. As gas, mixture gas of Ar of 450 ml/min (normal) and $O_2$ of 2 ml/min (normal) was used with a pressure of 0.5 Pa. A substrate temperature was 200° C. and electric power applied to the target was 1.1 kW with the respective magnetron sputtering units. As the substrate, a glass substrate was used.

Figure 4:
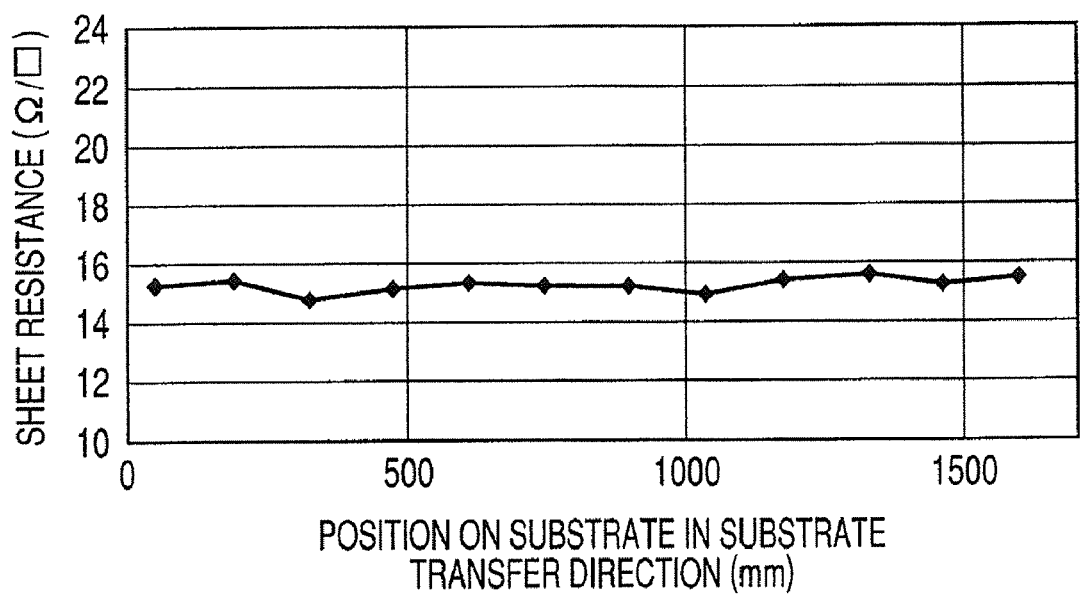
FIG. 4 is a graph illustrating sheet resistance distribution in a substrate transfer direction according to the present invention.

When the film is deposited under such a condition, an ITO film of 110 nm in thickness was deposited on a substrate and uniform film distribution was achieved in the substrate transfer direction. Further, sheet resistance distribution as well was uniform in the substrate transfer direction. FIG. 4 illustrates sheet resistance distribution in a substrate transfer direction. Ununiformity of sheet resistance in a transfer direction was ±3.0% and the ununiformity was improved compared with the conventional one. Moreover, an ITO film having a low sheet resistance value of less than 16 Ω/sq was obtained. Sheet resistance was measured by the four-probe method. As described above, the sputtering deposit apparatus according to the present invention allows uniformity of a sheet resistance value and film deposit of an ITO film having low resistance. Accordingly, a substrate deposited with an ITO film using the film deposit apparatus according to the present invention is favorably used as a substrate for various types of devices, particularly optical elements.

Figure 7:
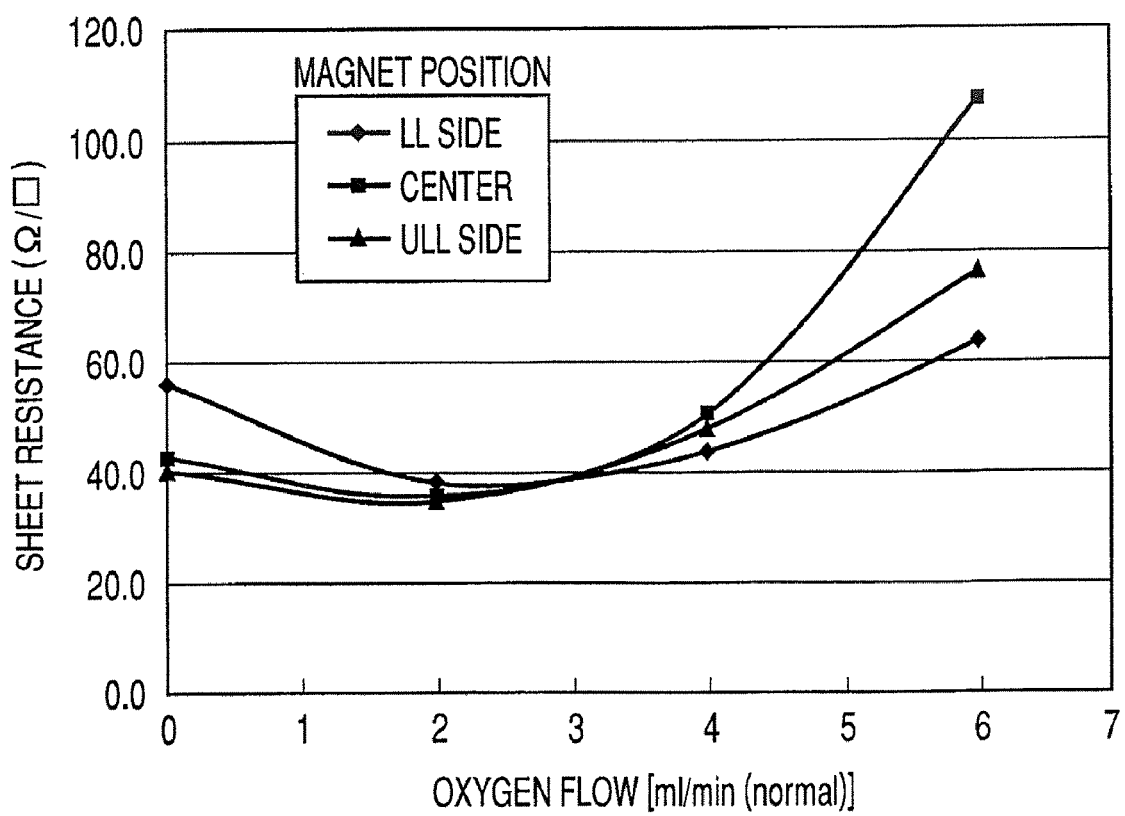
FIG. 7 is a graph illustrating sheet resistance changes of a film deposited by fixing a magnet at a predetermined position and changing an oxygen flow rate with a conventional sputtering apparatus.

Next, description will be made on a reason why sheet resistance distribution is improved by the sputtering apparatus according to the present embodiment. First, a sheet resistance change of a thin film deposited by a conventional sputtering apparatus will be described below. FIG. 7 is a graph illustrating sheet resistance changes of a thin film deposited by fixing a magnet at a predetermined position and changing an oxygen flow rate with only the first magnetron sputtering apparatus, using a conventional sputtering apparatus.

Magnet positions were on LL side, center and ULL side relative to a target. LL side and ULL side were 80 mm distant, respectively, from the center in a transfer direction and were positions on both ends of the reciprocating magnet.

Figure 6:
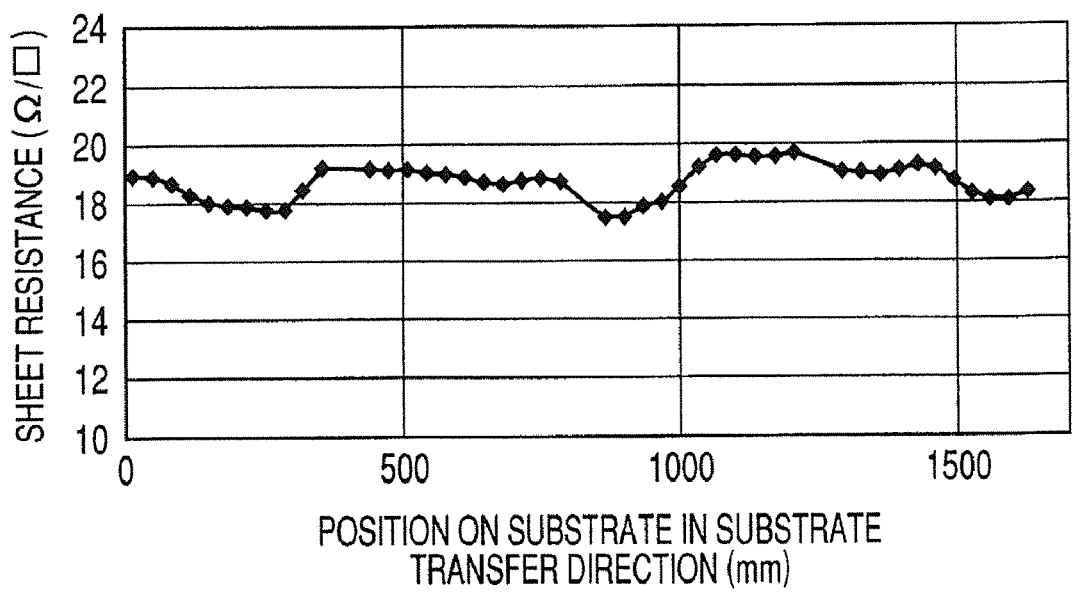
FIG. 6 is a graph illustrating sheet resistance distribution in a substrate transfer direction according to a conventional technique.

In the case of a magnet position on LL side, sheet resistance is minimum when an oxygen flow rate is approximately 3 ml/min (normal). On the other hand, in the case of a magnet position of center and ULL side, sheet resistance is minimum when an oxygen flow rate is approximately 2 ml/min (normal). Because oxygen flow rate dependency of sheet resistance varies depending on a magnet position, a thin film different in sheet resistance distribution is deposited on the substrate, depending on the magnet position. When the magnet is moved at a relatively low speed, the sheet resistance of a thin film deposited on the substrate periodically changes in the substrate transfer direction. In that case, the uniformity of sheet resistance within a substrate plane becomes poor (refer to FIG. 6).

Figure 5:
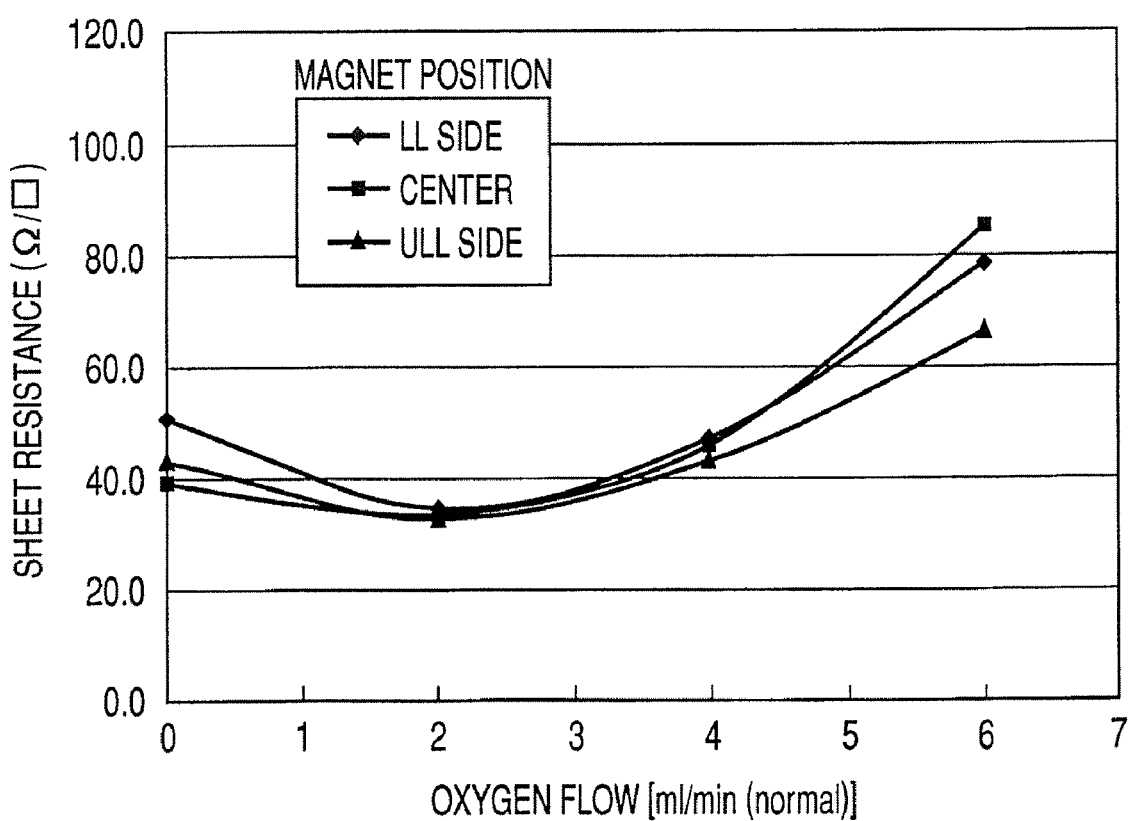
FIG. 5 is a graph illustrating sheet resistance changes of a film deposited by fixing a magnet at a predetermined position and changing an oxygen flow rate with a sputtering apparatus illustrated in FIG. 1.

Next, description will be made on sheet resistance changes of a thin film deposited by the sputtering apparatus according to the present embodiment. FIG. 5 is a graph illustrating sheet resistance changes of a film deposited by fixing a magnet at a predetermined position and changing an oxygen flow rate with only a first magnetron sputtering unit, using a sputtering apparatus illustrated in FIG. 2.

In a thin film deposited by the sputtering apparatus according to the present embodiment, in the case of a magnet on LL side, sheet resistance is minimum when an oxygen flow rate is approximately 2 ml/min (normal), in the same way as it is on the center and ULL side. The thin film deposited by the sputtering apparatus according to the present embodiment has little magnet position dependence. When an oxygen flow rate is 2 ml/min (normal), a sheet resistance value is almost the same regardless of a magnet position and a thin film having almost uniform sheet resistance is obtained on the substrate without depending on a magnet position.

In the film deposition of an ITO film, an oxygen flow rate is generally adjusted so that the lowest sheet resistance is obtained and therefore, in the present embodiment, the oxygen flow rate was taken as 2 ml/min (normal), so that the magnet position dependency of the sheet resistance is lowered, thus obtaining uniform sheet resistance.

The reason why magnetic position dependency of sheet resistance upon oxygen flow rate changes is lowered is unclear, but the following is supposed.

The target has an applied negative potential and the substrate is insulated and therefore the target has a floating potential. On the other hand, in a conventional film deposit apparatus, the cathode shield has a ground potential.

When the cathode shield serving as an anode is not near the magnet like a case where the magnet is in the center of the target, the density distribution of plasma generated around the target surface just above the magnet is symmetrical with respect to the magnet center. Accordingly, when the magnet approaches an end on LL side or ULL side by an oscillating motion, a neighbor cathode shield has a ground potential and therefore a good anode is obtained and a region having a high plasma density is deviated to the cathode shield side and is asymmetrical with respect to the magnet center. At this time, the region having high plasma density has higher efficiency of ionizing an oxygen molecule in gas into oxygen negative ion than a region having low plasma density and therefore many oxygen negative ions are accelerated toward the substrate from the region having high plasma density by an electric field in a target sheath to damage the substrate. The substrate damage increases the resistivity of an ITO film, so that in the case of a magnet on LL side or ULL side, the resistivity of an ITO film deposited by sputtering from a region near the end of the target becomes higher than in the case of a magnet in the center.

The substrate is deposited while being transferred and, when the magnet is at an end on LL side, a thin film having high resistivity is obtained in the initial growth phase of the thin film. The inventor found that in the case of low resistivity in initial growth phase, an ITO film having low resistivity is obtained regardless of the resistivity of a subsequently growing film. Accordingly, a conventional apparatus is supposed as follows: when a magnet of a first magnetron sputtering unit approaches LL side, the resistivity of a thin film firstly deposited on a substrate becomes high and a thin film deposited subsequently has high resistivity regardless of magnet position. Variations occur in values of the resistivity of an initial thin film, depending on a magnetic position in the initial film growth phase, that is, when a substrate is first sputtered, and therefore variations occur in values of the resistivity of the final thin film.

Accordingly, in the present invention, a cathode shield on the upstream side of a first magnetron sputtering unit (a first cathode shield) is electrically floated. The target shield as well is electrically floated. Accordingly, even if the magnet approaches LL side, no anode is next thereto, and plasma density is not deviated to a cathode on the upstream side and distribution of the same plasma density as in a case where the magnet is in the center of the target is obtained. Hence, a thin film having low resistivity is obtained at the initial film deposit. The resistivity of a thin film finally deposited is affected by the resistivity at the initial film deposit, and therefore it is supposed that an initially deposited thin film configured to have low resistance allows formation of a thin film having uniform sheet resistance.

At that time, a height level of the first cathode shield in a perpendicular direction to a target surface is almost the same as that of the target shield and therefore the spread of plasma in the substrate transfer direction is symmetrical with respect to the magnet center without being blocked by the cathode shield, thus facilitating to obtain the advantages described above.

Plasma density distribution generated in a space just above the magnet when the magnet position is on LL side is symmetrical with respect to the magnet position in the substrate transfer direction and a difference in oxygen flow rate dependency of sheet resistance became small.

The first magnetron sputtering unit according to the present embodiment is structured so that a height level of the second cathode shield in a perpendicular direction to a target surface is higher than that of the first cathode, which can prevent interference of discharge between the magnetron sputtering units.

Next, the reason why the first cathode shield of a floating potential is provided only on LL side of the first magnetron sputtering unit will be described.

The quality of a laminated thin film is largely affected by that of an initial thin film deposited on a substrate. Specifically, in the case of the configuration of the present embodiment of film deposition by lamination with a plurality of magnetron sputtering units, by the quality of a thin film deposited by the first magnetron sputtering unit, the quality of a subsequently laminated thin film is largely affected. If the first magnetron sputtering unit has a major change in quality, the quality of a subsequently deposited thin film also changes in the same way. To put it the other way around, if a thin film having uniform film quality can be deposited by the first magnetron sputtering unit, a thin film having uniform film quality can be deposited as the whole. Accordingly, by installing the first cathode shield of a floating potential on only LL side of the first magnetron sputtering unit, uniform film quality and improvement in sheet resistance distribution can be implemented.

Second Embodiment

Film deposition is performed under the same conditions as in the first embodiment except use of a substrate formed with an organic EL thin film, thereby obtaining an ITO film having uniform film quality without damaging the organic EL thin film. This is because when sputtering is performed by the apparatus of the present invention, an exposed organic EL thin film surface in the initial thin-film formation phase is hardly damaged by an oxygen negative ion.

Third Embodiment

An ITO film was deposited in the same way as in the first embodiment except use of a substrate prepared by depositing a metal thin film on a transparent insulating substrate, forming a gate electrode wire by pattern formation and forming a semiconductor layer on the gate electrode wire through a gate insulating film. Hence, an ITO film having uniform film quality is obtained without any damage to the semiconductor layer. This is because when sputtering by the apparatus of the present invention is performed a semiconductor layer surface in the initial thin-film formation phase is hardly damaged by an oxygen negative ion.

Fourth Embodiment

Next, a variation of the sputtering apparatus according to the present embodiment will be described.

In the foregoing description, there are two (two pairs) of magnetron sputtering units, but in the present embodiment, there are four (four pairs) of magnetron sputtering units, respectively, on both sides of a film deposit chamber 22. On each side of the film deposit chamber 22, the four magnetron sputtering units are arranged in this order toward the downstream side from the upstream side in the substrate transfer direction 43. The respective magnetron sputtering units used herein are called magnetron sputtering unit A, magnetron sputtering unit B, magnetron sputtering unit C and magnetron sputtering unit D, in the positioning order toward the upstream side from the downstream side in the substrate transfer direction. In the present variation as well, the first cathode shield of floating potential is provided on only LL side of a magnetron sputtering unit A positioned on the most upstream side in the substrate transfer direction (a first magnetron sputtering unit) and other magnetron sputtering units are provided with a second cathode shield of ground potential, respectively, on both sides of a target shield.

With the magnetron sputtering unit A as a basis, in the magnetron sputtering unit B, a phase of magnet movement was shifted by 180°. Further, with the magnetron sputtering unit A as a basis, in the magnetron sputtering unit C, a phase of magnet movement was shifted by 90° and, in magnetron sputtering unit D, a phase of magnet movement was shifted by 270°. The magnet operating conditions with the respective magnetron sputtering units were defined to be the same as the above.

By performing film deposition in the same way as the above using the sputtering apparatus of the present variation, an ITO film of 150 nm in thickness was deposited on a substrate and uniform film thickness distribution and uniform sheet resistance distribution were obtained in the substrate transfer direction.

The invention claimed is:

1. A film deposit apparatus for forming an ITO film, having at least two magnetron sputtering units arranged in a film deposit chamber in a substrate transfer direction to convey substrates while sequentially arranging the substrates opposite each of the magnetron sputtering units in the substrate transfer direction and to sequentially perform sputtering deposit while the substrates are opposed to each of the magnetron sputtering units during conveyance of the substrates, characterized in that:

each of the magnetron sputtering units comprises: a magnet reciprocating in a substrate transfer direction, a target, a target shield of a floating structure provided adjacent to an outer-periphery portion of the target and electrically insulated, and cathode shields provided adjacent to the outside of the target shield, and a first cathode shield of the cathode shields provided on the magnetron sputtering unit disposed on the most upstream side in the substrate transfer direction, is of a floating structure electrically insulated, and a second cathode shield, which comprises succeeding cathode shields in the substrate transfer direction, is connected to a ground potential.

2. The film deposit apparatus according to claim 1, characterized in that the top face of the first cathode shield is approximately flush with the top surface of the target shield in a height in the direction perpendicular to the target surface.

3. The film deposit apparatus according to claim 1, characterized in that the top face of the second cathode shield is higher than the top face of the first cathode shield by a predetermined distance in a height in the direction perpendicular to the target surface.

4. The film deposit apparatus according to claim 1, characterized in that a width of the first cathode shield in the substrate transfer direction is at least 50 mm.

5. The film deposit apparatus according to claim 1, characterized in that a reciprocating period of the magnet in the substrate transfer direction is at least one minute.

6. The film deposit apparatus according to claim 1, characterized in that a gas inlet is provided outside both ends of the target of the magnetron sputtering unit, respectively.

7. A method for manufacturing an element including a process of depositing an ITO film on a substrate, characterized in that an ITO film is deposited on a substrate, using a film deposit apparatus of claim 1.

8. The method for manufacturing an element according to claim 7, characterized in that the substrate is a substrate for an optical element.

9. The method for manufacturing an element according to claim 8, characterized in that the optical element is an organic EL element.

10. The method for manufacturing an element according to claim 8, characterized in that the optical element is a liquid crystal element.

11. A film deposit apparatus for an ITO film, comprising at least two magnetron sputtering units disposed in series and substrate transfer means for transferring a substrate in a substrate transfer direction along the serial direction, characterized in that each of the magnetron sputtering units includes:

magnet reciprocating means for reciprocating a magnet along the substrate transfer direction; target setting means for setting an ITO target;

a target shield which is disposed at a position adjacent to an outer-periphery portion of the ITO target and is of an electrically-insulated floating structure;

and cathode shields disposed adjacent to the outside of the target shield, and, a first cathode shield of the cathode shields, which is a cathode shield positioned on the most upstream side in the substrate transfer direction, is electrically insulated and is of a floating structure, and a second cathode shield, which comprises succeeding cathode shields in a substrate transfer direction, is connected to a ground voltage.

12. The film deposit apparatus according to claim 11, characterized in that the top face of the first cathode shield is approximately flush with the target surface in a height in the direction perpendicular to the target surface.

13. The film deposit apparatus according to claim 12, characterized in that the top face of the second cathode shield is higher than the top face of the first cathode shield by a predetermined distance in a height in the direction perpendicular to the target surface.

14. The film deposit apparatus according to claim 11, characterized in that a width of the first cathode shield in the substrate transfer direction is at least 50 mm.

15. The film deposit apparatus according to claim 11, characterized in that a reciprocating period of the magnet in the substrate transfer direction is at least one minute.

16. The film deposit apparatus according to claim 11, characterized in that a gas inlet is provided outside both ends of the target of the magnetron sputtering unit, respectively.

17. A method for manufacturing an element including a process of depositing an ITO film on a substrate, characterized in that an ITO film is deposited using a film deposit apparatus of claim 11.

18. The method for manufacturing an element according to claim 17, characterized in that the substrate is a substrate for an optical element.

19. The method for manufacturing an element according to claim 18, characterized in that the optical element is an organic EL element.

20. The method for manufacturing an element according to claim 18, characterized in that the optical element is a liquid crystal element.

* * * * *